United States Patent [19]

Gillery

[11] Patent Number: 5,178,966
[45] Date of Patent: Jan. 12, 1993

[54] COMPOSITE WITH SPUTTERED FILMS OF BISMUTH/TIN OXIDE

[75] Inventor: Frank H. Gillery, Allison Park, Pa.

[73] Assignee: PPG Industries, Inc., Pittsburgh, Pa.

[21] Appl. No.: 273,442

[22] Filed: Nov. 18, 1988

Related U.S. Application Data

[62] Division of Ser. No. 31,320, Mar. 26, 1987, Pat. No. 4,806,221.

[51] Int. Cl.$^5$ .............................................. B32B 17/06
[52] U.S. Cl. .................................. 428/623; 428/630; 428/633; 359/360
[58] Field of Search ............... 428/469, 630, 631, 432, 428/623, 701, 633; 350/1.6, 1.7

[56] References Cited

U.S. PATENT DOCUMENTS

| | | | |
|---|---|---|---|
| Re. 27,473 | 9/1972 | Mauer | 488/215 |
| 2,825,687 | 3/1958 | Preston et al. | 204/192 |
| 4,094,763 | 6/1978 | Gillery et al. | 204/192 |
| 4,113,599 | 9/1978 | Gillery | 204/192 |
| 4,166,018 | 8/1979 | Chapin | 204/192 |
| 4,201,649 | 5/1980 | Gillery | 204/192 |
| 4,327,967 | 5/1982 | Groth | 350/258 |
| 4,349,425 | 9/1982 | Miyake et al. | 204/192 |
| 4,462,883 | 7/1984 | Hart | 204/192 |
| 4,532,181 | 7/1985 | Brill et al. | 428/469 |
| 4,716,086 | 12/1987 | Gillery et al. | 428/630 |

FOREIGN PATENT DOCUMENTS 33413587 10/1985 Fed. Rep. of Germany .
732891 6/1955 United Kingdom .

Primary Examiner—Melvyn J. Andrews
Assistant Examiner—Margery S. Phipps
Attorney, Agent, or Firm—Donna L. Seidel

[57] ABSTRACT

A novel metal oxide sputtered film comprising bismuth and tin is disclosed on a high transmittance, low emissivity coated glass substrate.

1 Claim, No Drawings

COMPOSITE WITH SPUTTERED FILMS OF BISMUTH/TIN OXIDE

This is a division of application Ser. No. 31,320, filed Mar. 26, 1987, now U.S. Pat. No. 4,806,221.

BACKGROUND OF THE INVENTION

The present invention relates generally to the art of cathode sputtering of metal oxide films, and more particularly to the art of magnetic sputtering of multiple layer films of metal and metal oxide.

U.S. Pat. No. 4,094,763 to Gillery et al discloses producing transparent, electroconductive articles by cathode sputtering metals such as tin and indium onto refractory substrates such as glass at a temperature above 400° F. in a low pressure atmosphere containing a controlled amount of oxygen.

U.S. Pat. No. 4,113,599 to Gillery teaches a cathode sputtering technique for the reactive deposition of indium oxide in which the flow rate of oxygen is adjusted to maintain a constant discharge current while the flow rate of argon is adjusted to maintain a constant pressure in the sputtering chamber.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface.

U.S. Pat. No. 4,201,649 to Gillery discloses a method for making low resistance indium oxide thin films by first depositing a very thin primer layer of indium oxide at low temperature before heating the substrate to deposit the major thickness of the conductive layer of indium oxide by cathode sputtering at typically high cathode sputtering temperatures.

U.S. Pat. No. 4,327,967 to Groth discloses a heat-reflecting panel having a neutral-color outer appearance comprising a glass pane, an interference film having a refractive index greater than 2 on the glass surface, a heat reflecting gold film over the interference film and a neutralization film of chromium, iron, nickel, titanium or alloys thereof over the gold film.

U.S. Pat. No. 4,349,425 to Miyake et al discloses d-c reactive sputtering of cadmium-tin alloys in argon-oxygen mixtures to form cadmium-tin oxide films having low electrical resistivity and high optical transparency.

U.S. Pat. No. 4,462,883 to Hart discloses a low emissivity coating produced by cathode sputtering a layer of silver, a small amount of metal other than silver, and an anti-reflection layer of metal oxide onto a transparent substrate such as glass. The anti-reflection layer may be tin oxide, titanium oxide, zinc oxide, indium oxide, bismuth oxide or zirconium oxide.

U.S. Pat. No. Re. 27,473 to Mauer discloses a multi-layer transparent article comprising a thin layer of gold or copper sandwiched between two layers of transparent material such as various metals, titanium oxide, lead oxide or bismuth oxide.

In the interest of improving the energy efficiency of double-glazed window units, it is desirable to provide a coating on one of the glass surfaces which increases the insulating capability of the unit by reducing radiative heat transfer. The coating therefore must have a low emissivity in the infrared wavelength range of the radiation spectrum. For practical reasons, the coating must have a high transmittance in the visible wavelength range. For aesthetic reasons, the coating should have a low luminous reflectance and preferably be essentially colorless.

High transmittance, low emissivity coatings as described above generally comprise a thin metallic layer, for infrared reflectance and low emissivity, sandwiched between dielectric layers of metal oxides to reduce the visible reflectance. These multiple layer films are typically produced by cathode sputtering, especially magnetron sputtering. The metallic layer may be gold or copper, but is generally silver. The metal oxide layers described in the prior art include tin oxide, indium oxide, titanium oxide, bismuth oxide, zinc oxide, zirconium oxide and lead oxide. In some cases, these oxides incorporate small amounts of other metals, such as manganese in bismuth oxide, indium in tin oxide and vice versa, to overcome certain disadvantages such as poor durability or marginal emissivity. However, all of these metal oxides have some deficiency.

Although the coating may be maintained on an interior surface of a double-glazed window unit in use, where it is protected from the elements and environmental agents which would cause its deterioration, a durable effective coating able to withstand handling, packaging, washing and other fabrication processes encountered between manufacture and installation is particularly desirable. These properties are sought in the metal oxide. However, in addition to hardness which provides mechanical durability, inertness which provides chemical durability, and good adhesion to both the glass and the metal layer, the metal oxide should have the following properties as well.

The metal oxide must have a reasonably high refractive index, preferably greater than 2.0, to reduce the reflection of the metallic layer and thus enhance the transmittance of the coated product. The metal oxide must also have minimal absorption to maximize the transmittance of the coated product. For commercial reasons, the metal oxide should be reasonably priced, have a relatively fast deposition rate by magnetron sputtering, and be nontoxic.

A most important, and most difficult to satisfy, requirement of the metal oxide film relates to its interaction with the metallic film. The metal oxide film must have low porosity, to protect the underlying metallic film from external agents, and low diffusivity for the metal to maintain the integrity of the separate layers. Finally, the metal oxide must provide a good nucleation surface for the deposition of the metallic layer, so that a continuous metallic film can be deposited with minimum resistance and maximum transmittance. The characteristics of continuous and discontinuous silver films are described in U.S. Pat. No. 4,462,884 to Gillery et al, the disclosure of which is incorporated herein by reference.

Of the metal oxide films in general use, zinc oxide and bismuth oxide are insufficiently durable, being soluble in both acid and alkaline agents, degraded by fingerprints, and destroyed in salt, sulfur dioxide and humidity tests. Indium oxide, preferably doped with tin, is more durable; however, indium sputters slowly and is relatively expensive. Tin oxide, which may be doped with indium or antimony, is also more durable, but does not provide a suitable surface for nucleation of the silver film, resulting in high resistance and low transmittance. The characteristics of a metal oxide film which result in proper nucleation of a subsequently deposited silver film have not been established; however, trialand-error experimentation has been widely practiced with the metal oxides described above.

U.S. Pat. No. 4,610,771 to Gillery discloses sputtering zinc and tin in an oxidizing atmosphere to deposit a zinc/tin oxide film, and employing a zinc/tin oxide film as an antireflective film in combination with a metallic film such as silver to produce a high transmittance, low emissivity coated article.

SUMMARY OF THE INVENTION

The present invention provides a novel film composition of an oxide comprising bismuth and tin, as well as a novel multiple-layer film of metal and oxide layers comprising bismuth and tin for use as a high transmittance, low emissivity coating.

DETAILED DESCRIPTION OF THE PREFERRED EMBODIMENTS

A novel film composition comprising an oxide of bismuth and tin is preferably deposited by cathode sputtering, preferably magnetron sputtering. A cathode target is prepared comprising the desired ratio of bismuth and tin, preferably in the form of a bismuth/tin alloy. The target is then sputtered in a reactive atmosphere, preferably containing oxygen in order to deposit an oxide film comprising bismuth and tin on a surface of a substrate.

A preferred metal oxide in accordance with the present invention is an oxide compound comprising bismuth and tin. A bismuth/tin oxide film may be deposited in accordance with the present invention by cathode sputtering, preferably magnetically enhanced. Cathode sputtering is also a preferred method for depositing high transmittance, low emissivity films in accordance with the present invention. Such films typically comprise multiple layers, preferably a layer of highly reflective metal such as gold, silver or copper sandwiched between anti-reflective metal oxide layers such as indium oxide or titanium oxide. In accordance with the present invention, the preferred anti-reflective metal oxide layer comprises an oxide compound of bismuth and tin, and preferably comprises bismuth stannate, a novel oxide of the apparent formula $Bi_2Sn_4O_{11}$.

While the characteristics of a metal oxide film cannot always be predicted with respect to its performance in combination with a metallic film layer to form a high transmittance, low emissivity coating, various tests may be performed to determine its durability and its effectiveness in regard to nucleation of a silver film. Durability properties are of greater importance to the metal oxide film when it is placed over the silver film. Nucleation properties are more important when the silver is deposited over the metal oxide. In a most preferred embodiment or the present invention, both anti-reflective metal oxide layers comprise an oxide of bismuth and tin.

For durability, there are heat tests which measure changes in transmittance, reflectance and color of the coating as an indication of long-term stability; accelerated weathering and exposure tests which measure the effects of such environmental conditions as ultraviolet radiation, humidity and salt (fingerprints or coastal environment); a sulfur dioxide test to determine the susceptability of the coating to damage by acidic atmospheric pollutants, and a test to determine whether the coating is damaged by a conventional glass washer and acidic or alkaline detergents.

A nucleation test may be performed to evaluate the effects of the metal oxide on the deposition of a metallic layer such as silver. To perform the nucleation test, a layer of the metal oxide is deposited on a substrate surface. A given weight of silver per unit area of substrate surface is then deposited over the metal oxide. Finally, a second layer of metal oxide is deposited over the silver layer. The first effect to be evaluated is the decrease in transmittance as the silver is deposited: the less the decrease in transmittance, the lower the absorption and the better the nucleation. The second effect is the surface resistance of the multiple layer coating: the lower the resistance, the better the nucleation. The third effect is the final transmittance of the multiple layer coating: the higher the transmittance, the better the nucleation.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process. The bismuth/tin oxide film of the present invention may be deposited directly onto such a substrate surface, or over other layers of metal and/or metal oxides, including primers to improve adhesion as shown in U.S. Pat. No. 4,622,120, the disclosure of which is incorporated herein by reference.

The cathode may be of any conventional design, preferably an elongated rectangular design, connected with a source of electrical potential, and preferably employed in combination with a magnetic field to enhance the sputtering process. At least one cathode target surface comprises bismuth and tin which is sputtered in a reactive atmosphere to form an oxide film comprising bismuth and tin. The anode is preferably a symmetrically designed and positioned assembly as taught in U.S. Pat. No. 4,478,702 to Gillery et al, the disclosure of which is incorporated herein by reference.

In a preferred embodiment of the present invention, a multiple layer film is deposited by cathode sputtering to form a high transmittance, low emissivity coating. In addition to a bismuth/tin target, at least one other cathode target surface comprises a metal to be sputtered to form an infrared reflective metallic layer, preferably silver. A multiple layer coating having a reflective metallic layer in combination with anti-reflective metal oxide layers is produced as follows.

A clean glass substrate is placed in a coating chamber which is evacuated, preferably to less than $10^{-4}$ torr, more preferably less than $2 \times 10^{-5}$ torr. A selected atmosphere of inert and reactive gases, preferably argon and oxygen, is established in the chamber to a pressure between about $5 \times 10^{-4}$ and $10^{-2}$ torr. A cathode having a target surface of bismuth and tin is operated over the surface of the substrate to be coated. The target metal is sputtered, reacting with the atmosphere in the chamber to deposit an oxide coating layer comprising bismuth and tin on the glass surface.

After the initial layer of bismuth/tin oxide is deposited, the coating chamber is evacuated, and an inert atmosphere such as pure argon is established at a pressure between about $5 \times 10^{-4}$ and $10^{-2}$ torr. A cathode having a target surface of silver metal is operated over the bismuth/tin oxide coated surface. The target metal is sputtered and deposits a reflective, conductive metallic layer on the bismuth/tin oxide coated glass surface. A second layer of bismuth/tin oxide is deposited on the silver layer under essentially the same conditions used to deposit the first bismuth/tin oxide layer. A transparent metal-containing film is preferably deposited between the silver film and the bismuth/tin oxide layer.

The present invention will be further understood from the descriptions of specific examples which follow. In the examples, the bismuth/tin oxide film may be referred to as bismuth stannate, irrespective of the ratio of bismuth and tin in the oxide.

EXAMPLES

A stationary cathode comprises a sputtering surface which is one-third bismuth and two-thirds tin. A soda-lime-silica glass substrate is placed in the coating chamber which is evacuated to establish a pressure of 4 millitorr in an atmosphere comprising 50 percent argon and 50 percent oxygen. The cathode is sputtered in a magnetic field at a power of 1.7 kilowatts while the glass is conveyed past the sputtering surface at a rate of 110 inches (2.8 meters) per minute. A film of bismuth/tin oxide is deposited on the glass surface. The metal oxide film provides a bismuth/tin gradient ranging from about 60 percent bismuth to only about 1 percent bismuth, based on the weight of metal. A uniform layer of silver is sputtered over the bismuth/tin oxide, and a second layer of bismuth/tin oxide is sputtered over the silver.

The resistance of the coating is in the range of 5 to 10 ohms over this range of bismuth/tin in the oxide. After heating the coated substrate for 12 minutes at 1100° F. (about 593° C.), resistance and color changes are noted over much of the gradient film. However, in the range of about 40 to 55 percent bismuth and in a particularly preferred range of 45 to 50 percent bismuth, the resistance and color are stable, suggesting the formation of an oxide compound having the formula $Bi_2Sn_4O_{11}$. While tin oxide has a refractive index of about 2.0, the bismuth stannate appears to have a refractive index closer to that of bismuth oxide, which is about 2.3. The higher refractive index permits use of a thicker silver film in a multiple layer high transmittance low emissivity coating without changing the optical properties, thereby providing a lower emissivity at a given transmittance. The properties of the gradient bismuth/tin oxide film of this example are summarized in the following table.

TABLE I

| SAMPLE | % BISMUTH (Wt of metal) | RESISTANCE (Ohms) Before* | RESISTANCE (Ohms) After* | COLOR Before* | COLOR After* |
| --- | --- | --- | --- | --- | --- |
| 1 | 60 | 4.9 | ∞ | — | — |
| 2 | 57 | 4.9 | ∞ | blue | red-yellow |
| 3 | 52 | 5.3 | 11.0 | blue | red-blue |
| 4 | 47.5 | 5.5 | 5.3 | blue | blue |
| 5 | 43 | 5.8 | 9.5 | blue | blue |
| 6 | 31 | 6.3 | ∞ | red | yellow |
| 7 | 19 | 6.9 | ∞ | red | yellow |
| 8 | 12 | 7.1 | 11.6 | pink | hazy |
| 9 | 7 | 7.5 | 9.5 | pink | hazy |
| 10 | 4 | 8.1 | 9.5 | pink | hazy |
| 11 | 3 | 8.5 | 5.3 | pink | hazy |
| 12 | 2 | 8.9 | 5.0 | pink | hazy |
| 13 | 1 | 9.6 | 6.0 | pink | hazy |

*heating 12 minutes at 1100° F. (about 593° C.)

While optimum resistance and color properties are obtained in a relatively narrow range corresponding to the composition $Bi_2Sn_4O_{11}$, the durability of a bismuth/tin oxide film in salt solution extends over the range of about 12 to at least 60 percent bismuth, the limit of this experimental range. These results are summarized qualitatively in Table II.

TABLE II

| | | Salt Test (Immersion in 2½% Salt Solution at Room Temperature) | |
| --- | --- | --- | --- |
| Sample | % Bi (Wt. of Metal) | Immersion Time 2 Hours | Immersion Time 5 Hours |
| 1 | 60 | No attack | No attack |
| 2 | 57 | " | " |
| 3 | 52 | " | " |
| 4 | 47.5 | " | " |
| 5 | 43 | " | " |
| 6 | 31 | " | " |
| 7 | 19 | Slight attack | Slight attack |
| 8 | 12 | Moderate attack | Moderate attack |
| 9 | 7 | Heavy attack | Heavy attack |
| 10 | 4 | " | " |
| 11 | 3 | " | " |
| 12 | 2 | " | " |
| 13 | 1 | " | " |

Previous tests have shown that coatings based on pure bismuth oxide suffer moderate attack in 20 minutes. Those of pure tin oxide are attacked in 2 hours.

The durability of bismuth/tin oxide coatings in humidity testing is improved over either bismuth oxide or tin oxide. Bismuth/tin oxide coatings in the tested range, from 4 to 60 percent bismuth, resist attack for at least 5 hours. By comparison, both bismuth oxide and tin oxide are attacked within 2 hours in the Cleveland test, which involves continuous condensation at 150° F. (about 66° C.). Thus, a much broader ratio of bismuth/tin in the oxide is acceptable if the coating is not subjected to high temperature processing such as bending, welding or tempering.

The above examples are offered to illustrate the present invention. Various modifications of the product and the process are included. For example, other coating compositions are within the scope of the present invention. The bismuth stannate coating may be used alone or in combination with various other films. For high transmittance, low emissivity films, bismuth/tin oxide may be used with reflective metallic films other than silver, with various primer layers and/or protective overcoats, and as either the top or bottom antireflective film in combination with other metal oxides, preferably as the top film for durability. Most preferably both antireflective films comprise bismuth/tin oxide. Depending on the proportions of bismuth and tin, the coating may contain various amounts of bismuth and tin oxides in addition to bismuth stannate. Since the magnetron sputtering process does not require very high temperatures, substrates other than glass, such as various plastics, may be coated. Process parameters such as pressure and concentration of gases may be varied over a broad range. The scope of the present invention is defined by the following claims.

I claim:
1. A high transmittance, low emissivity article comprising:
   a. a transparent glass substrate;
   b. a first transparent oxide film comprising bismuth and tin deposited on a surface of said substrate;
   c. a transparent metallic film deposited on said first bismuth/tin oxide film;
   d. a transparent metal-containing film comprising bismuth and tin deposited on said transparent metallic film; and
   e. a second transparent oxide film comprising bismuth and tin deposited on said metallic film.

* * * * *